(12) United States Patent
Avila et al.

(10) Patent No.: US 9,760,307 B2
(45) Date of Patent: Sep. 12, 2017

(54) WEIGHTED READ SCRUB FOR NONVOLATILE MEMORY INCLUDING MEMORY HOLES

(71) Applicant: SanDisk Technologies LLC, Plano, TX (US)

(72) Inventors: Chris Avila, Saratoga, CA (US); Yingda Dong, San Jose, CA (US); Alexander Kwok-Tung Mak, Los Altos Hills, CA (US); Steven T. Sprouse, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/861,953

(22) Filed: Sep. 22, 2015

(65) Prior Publication Data

US 2016/0026410 A1  Jan. 28, 2016

Related U.S. Application Data

(63) Continuation of application No. 13/801,741, filed on Mar. 13, 2013, now Pat. No. 9,171,620.

(60) Provisional application No. 61/731,215, filed on Nov. 29, 2012.

(51) Int. Cl.
*G11C 16/04* (2006.01)
*G06F 3/06* (2006.01)
*G06F 11/10* (2006.01)

(52) U.S. Cl.
CPC .......... *G06F 3/0652* (2013.01); *G06F 3/0619* (2013.01); *G06F 3/0679* (2013.01); *G06F 11/106* (2013.01); *G11C 16/04* (2013.01)

(58) Field of Classification Search
CPC .... G06F 3/0652; G06F 3/0679; G06F 3/0619; G06F 11/106; G11C 16/04
USPC ............ 365/185.02, 185.03, 185.09, 185.11, 365/185.12, 185.17, 185.18
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |

(Continued)

FOREIGN PATENT DOCUMENTS

| | | |
|---|---|---|
| WO | 2009088920 A1 | 7/2009 |
| WO | 2010030701 A1 | 3/2010 |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Tha-O H Bui
(74) *Attorney, Agent, or Firm* — Stoel Rives LLP

(57) ABSTRACT

An array of non-volatile memory cells includes a first plurality of nonvolatile memory cells and a second plurality of non-volatile memory cells. The first plurality of memory cells, which have first diameters of memory holes, are assigned to store portions of data that are not frequently read. The second plurality of memory cells, which have second diameters of memory holes, are assigned to store portions of data that are frequently read. The first diameters are smaller than the second diameters.

20 Claims, 17 Drawing Sheets

(56) References Cited

U.S. PATENT DOCUMENTS

| | | | |
|---|---|---|---|
| 5,315,541 | A | 5/1994 | Harari et al. |
| 5,343,063 | A | 8/1994 | Yuan et al. |
| 5,570,315 | A | 10/1996 | Tanaka et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,099,194 | B2 | 8/2006 | Tu et al. |
| 7,173,852 | B2 | 2/2007 | Gorobets et al. |
| 7,477,547 | B2 | 1/2009 | Lin |
| 7,518,919 | B2 | 4/2009 | Gonzalez et al. |
| 7,616,481 | B2 | 11/2009 | Mokhlesi et al. |
| 7,839,685 | B2 | 11/2010 | Auclair et al. |
| 8,050,095 | B2 | 11/2011 | Gonzalez et al. |
| 8,301,912 | B2 | 10/2012 | Lin et al. |
| 8,468,294 | B2 | 6/2013 | Huang et al. |
| 8,472,257 | B2 | 6/2013 | Dong et al. |
| 8,587,997 | B2 | 11/2013 | Kim et al. |
| 8,687,421 | B2 | 4/2014 | Avila et al. |
| 8,705,286 | B2 | 4/2014 | Li |
| 8,830,717 | B2 | 9/2014 | Avila et al. |
| 8,873,288 | B2 | 10/2014 | Sharon et al. |
| 8,902,661 | B1 | 12/2014 | Raghu et al. |
| 8,982,637 | B1 | 3/2015 | Dong et al. |
| 9,142,298 | B2 | 9/2015 | Dong et al. |
| 9,230,689 | B2 * | 1/2016 | Tuers ............... G11C 29/50004 |
| 9,349,479 | B1 * | 5/2016 | Sehgal ............... G11C 16/3427 |
| 2005/0122779 | A1 | 6/2005 | Fasoli et al. |
| 2006/0039196 | A1 | 2/2006 | Gorobets et al. |
| 2007/0263439 | A1 | 11/2007 | Cornwell et al. |
| 2008/0239851 | A1 | 10/2008 | Lin |
| 2008/0288814 | A1 | 11/2008 | Kitahara |
| 2008/0294949 | A1 | 11/2008 | Sugahara |
| 2009/0043947 | A1 | 2/2009 | Tringali et al. |
| 2009/0168533 | A1 | 7/2009 | Park et al. |
| 2009/0204824 | A1 | 8/2009 | Lin et al. |
| 2009/0323942 | A1 | 12/2009 | Sharon et al. |
| 2010/0070682 | A1 | 3/2010 | Wan et al. |
| 2010/0322000 | A1 | 12/2010 | Shim et al. |
| 2011/0032759 | A1 | 2/2011 | Kim et al. |
| 2011/0038203 | A1 | 2/2011 | Camp et al. |
| 2011/0119431 | A1 | 5/2011 | Chowdhury |
| 2011/0161784 | A1 | 6/2011 | Selinger et al. |
| 2012/0051137 | A1 | 3/2012 | Hung et al. |
| 2012/0166708 | A1 | 6/2012 | Chung et al. |
| 2012/0220088 | A1 | 8/2012 | Alsmeier |
| 2012/0239861 | A1 | 9/2012 | Lee et al. |
| 2012/0272017 | A1 | 10/2012 | Lee et al. |
| 2012/0297111 | A1 | 11/2012 | Hsu et al. |
| 2013/0107628 | A1 | 5/2013 | Dong et al. |
| 2013/0201760 | A1 | 8/2013 | Dong et al. |
| 2014/0359398 | A1 | 12/2014 | Avila et al. |
| 2015/0121156 | A1 | 4/2015 | Raghu et al. |
| 2015/0121157 | A1 | 4/2015 | Raghu et al. |

FOREIGN PATENT DOCUMENTS

| | | |
|---|---|---|
| WO | 2011019600 A1 | 2/2011 |
| WO | 2011019602 A2 | 2/2011 |
| WO | 2012023102 A1 | 2/2012 |

OTHER PUBLICATIONS

U.S. Appl. No. 61/731,198, filed Nov. 29, 2012, 32 pages.
U.S. Appl. No. 61/731,215, filed Nov. 29, 2012, 42 pages.
Technical Search Report, Dec. 18, 2012, 8 pages.
Invitation to Pay Additional Fees and, Where Applicable, Protest Fees issued in International Patent Application No. PCT/US2013/071430, mailed Apr. 2, 2014, 6 pages.
International Search Report and Written Opinion issued in International Patent Application No. PCT/US2013/071430, mailed Jun. 18, 2014, 14 pages.

* cited by examiner

Programming into four states represented by a 2-bit code

WEIGHTED READ SCRUB FOR NONVOLATILE MEMORY INCLUDING MEMORY HOLES

CROSS REFERENCE TO RELATED APPLICATIONS

This application is a continuation of U.S. application Ser. No. 13/801,741, filed Mar. 13, 2013, now issued as U.S. Pat. No. 9,171,620, which claims the benefit of Provisional Patent Application No. 61/731,215, filed on Nov. 29, 2012, which are incorporated by reference in their entirety.

BACKGROUND

This application relates to the operation of re-programmable non-volatile memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

Examples of the present invention relate to schemes to overcome disturbance of data in charge-storage memory cells when other cells in the array are accessed. Scrubbing of data that is most at risk of disturbance may be prioritized. Data that is likely to be frequently read may be relocated to a location where reading it is less likely to affect other data.

An example of a method of operating a charge-storage memory array includes: identifying victim data stored in a victim location in the charge-storage memory that is likely to be affected by a read of aggressor data in an aggressor location in the charge-storage memory; assigning a scrub-priority value to the victim-data, the scrub-priority value representing a degree of likely damage to the victim-data caused by the read of the aggressor-data; and subsequently scrubbing data stored in the charge-storage memory according to an order that is based on the scrub-priority value.

The victim location and the aggressor location may both be in a set of strings of series-connected charge-storage memory cells that are selected during the read, the aggressor location being along a selected word line, the victim location being along an unselected word line. The aggressor location may be along a selected word line of a selected set of strings during the read and the victim location may be along a selected word line of an unselected set of strings during the read. The order may be based on physical characteristics of different locations in the charge-storage memory array. A plurality of scrub-priority values may be maintained for a plurality of portions of data stored in the charge-storage memory array. One or more of the plurality of scrub-priority values may be updated whenever one of the portions of data is read. The order may be based on updated scrub-priority values. The order may be further based on a location where the victim-data is stored.

An example of a method of operating a charge-storage memory array includes: identifying a portion of data that is stored in the charge-storage memory array as likely to be frequently read; and in response to identifying the portion of data as likely to be frequently read, relocating the portion of data from a first location in the charge-storage memory array to a second location in the charge storage memory array, the second location selected according to a physical characteristic of memory cells in the second location.

The second location may provide a level of read disturbance of data in other locations when reading data in the second location that is less than a level of read disturbance of data in other locations when reading data in the first location. The physical characteristic of memory cells in the second location may be the diameter of a vertical hole that extends through a plurality of word lines. The physical characteristic may be vertical distance from a substrate. The portion of data may be identified as likely to be frequently read as a result of an observed frequency of reads of the portion of data.

An example of a method of operating a three-dimensional NAND memory includes: storing a plurality of portions of data at a respective plurality of locations in the three-dimensional NAND memory; assigning a plurality of scrub-priority values to the plurality of portions of data according to their respective physical locations; and scrubbing the plurality of portions of data according to a scheme based on the plurality of scrub-priority values.

The plurality of scrub-priority values may be modified in response to access operations directed to individual portions of data of the plurality of portions of data. The plurality of scrub-priority values may be assigned according to vertical distance from a substrate. Portions of data stored at physical locations closest to the substrate may be scrubbed before portions of data stored at locations that are farther from the substrate.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
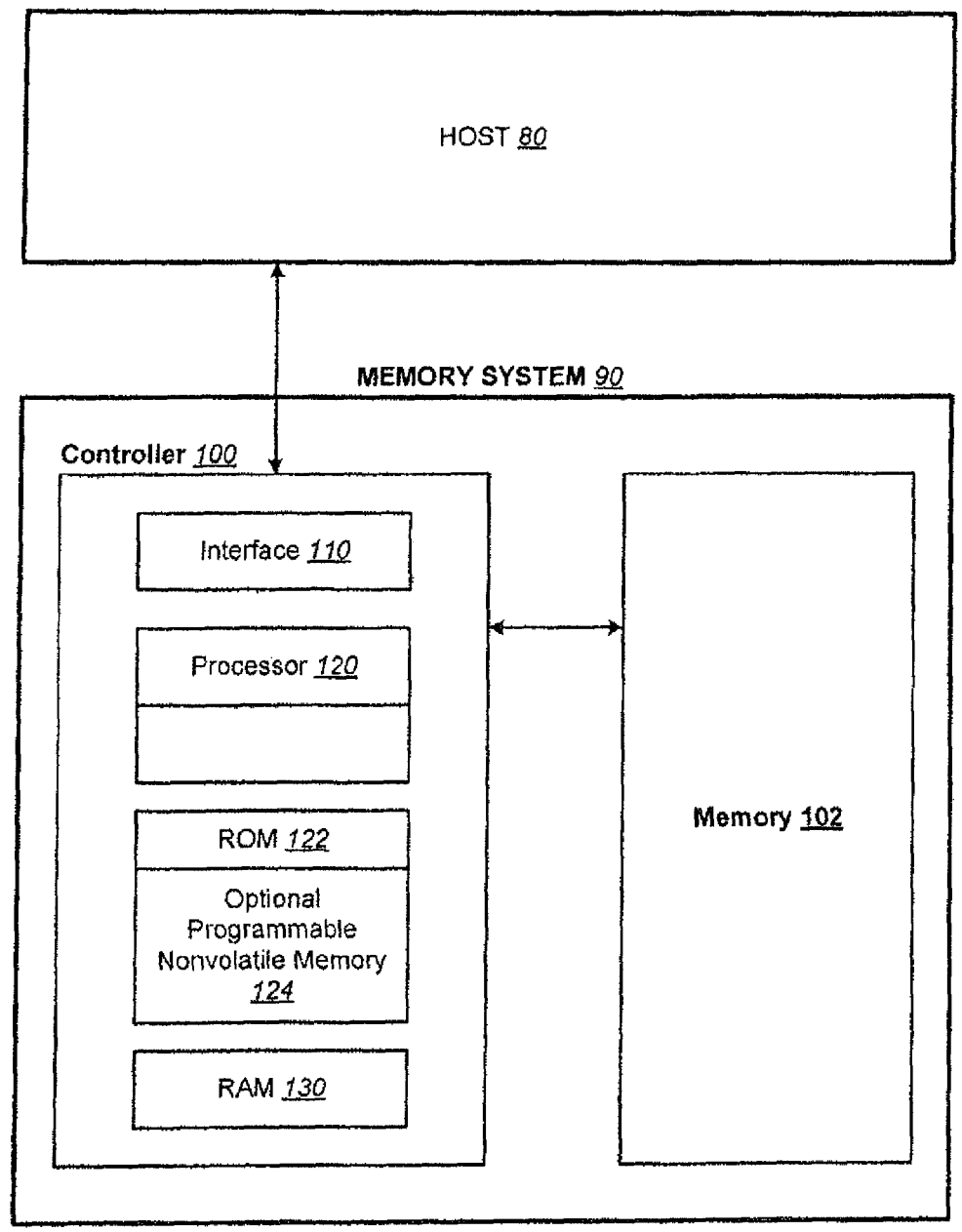
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. A controller is typically formed as an ASIC (application specific integrated circuit) and the components included in such an ASIC generally depend on the particular application.

Physical Memory Structure

Figure 2:
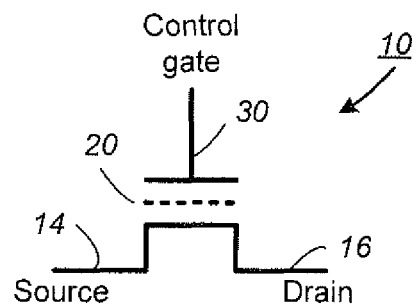
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
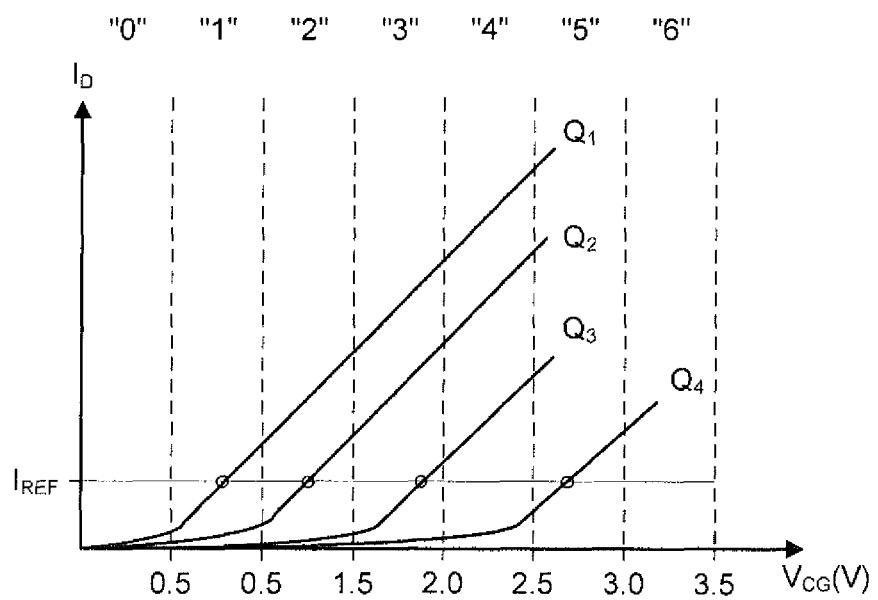
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four different memory states. As an example, the threshold voltage window of a population of cells may range from 0.5V to 3.5V. Seven programmed memory states "0", "1", "2", "3", "4", "5", "6", respectively and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from -1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
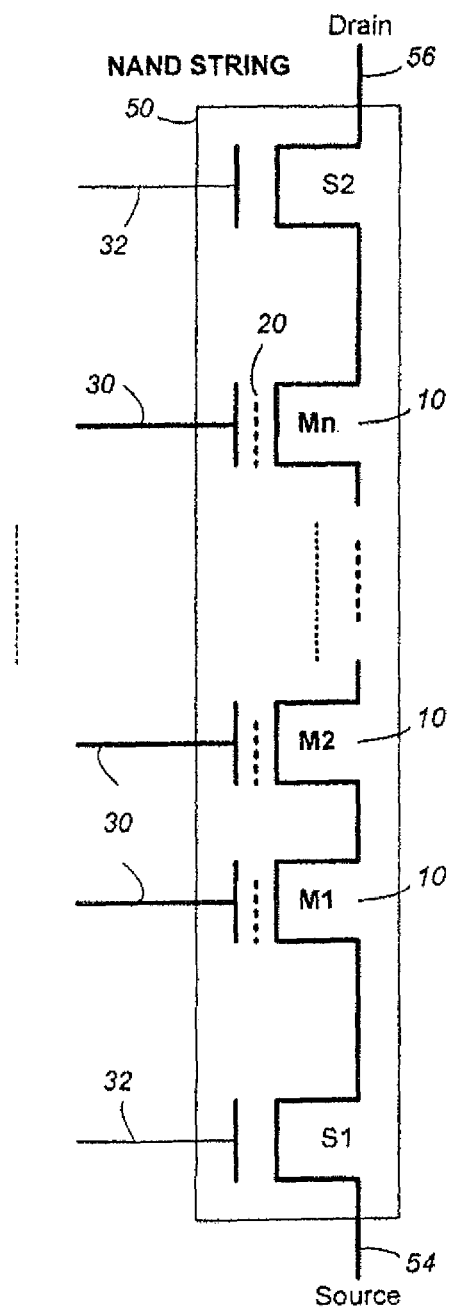
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
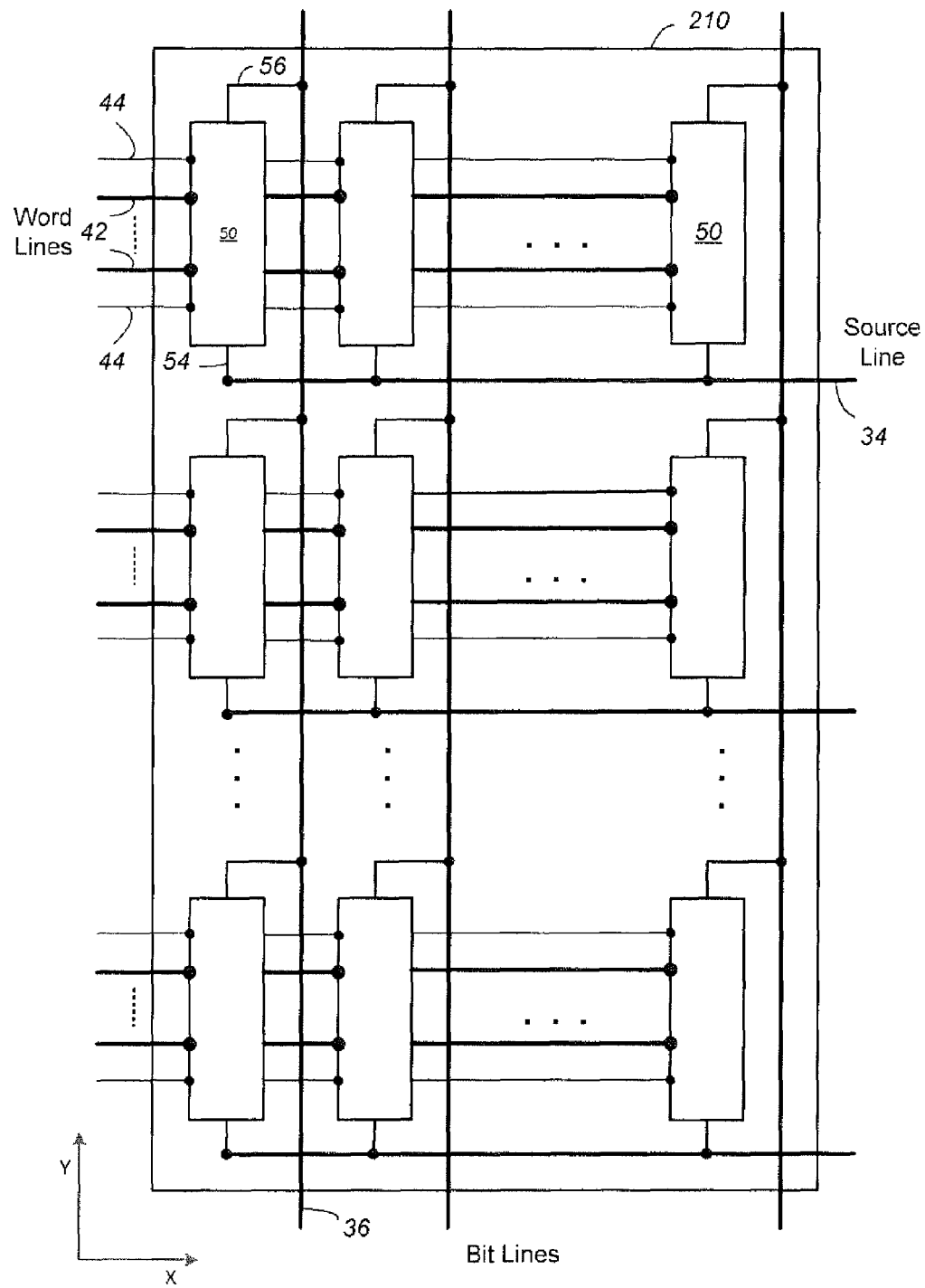
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
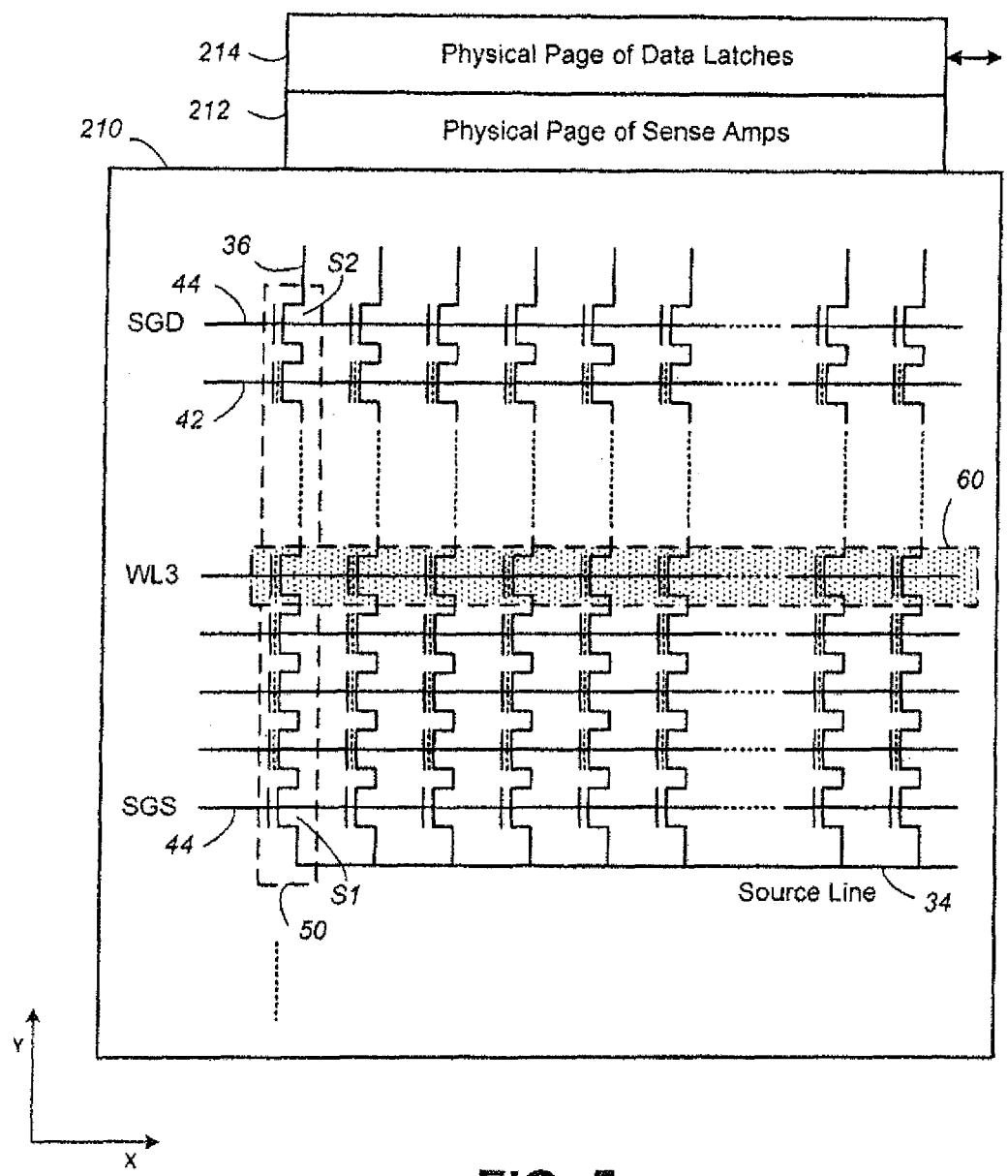
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212 (illustrated as "Physical Page of Sense Amps" 212 in FIG. 5). The sensed results are latched in a corresponding set of latches 214 (illustrated as "Physical Page of Data Latches" 214 in FIG. 5). Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
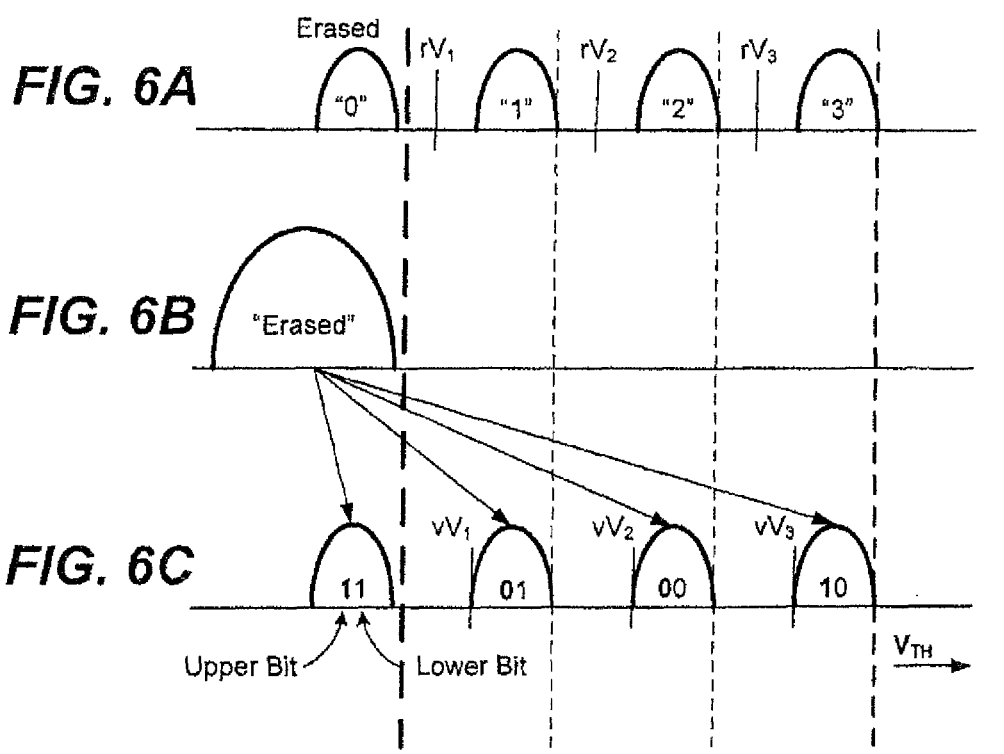
FIGS. 6A-6C illustrate an example of programming a population of 4-state memory cells.

FIG. 6A-6C illustrate an example of programming a population of 4-state memory cells. FIG. 6A illustrates the population of memory cells programmable into four distinct distributions of threshold voltages $V_{TH}$ respectively representing memory states "0", "1", "2" and "3". FIG. 6B illustrates the initial distribution of "erased" threshold voltages $V_{TH}$ for an erased memory. FIG. 6C illustrates an example of the memory after many of the memory cells have been programmed. Essentially, a cell initially has an "erased" threshold voltage $V_{TH}$ and programming will move it to a higher value into one of the three zones demarcated by verify levels $vV_1$, $vV_2$, and $vV_3$. In this way, each memory cell can be programmed to one of the three pre-programmed states "1", "2", and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10'. The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Data Disturbance

Data that is stored using charge storage may be affected by a number of different phenomena that cause changes in the amount of charge stored in a cell and therefore can cause incorrect data to be read out. Charge may enter or leave a charge storage element as a result of voltages experienced during operations directed to neighboring memory cells. For example, when programming or reading a selected memory cell, other cells that are not being programmed or read may be affected by the voltages applied along various components of the memory array. For any given memory access operation, some memory cells, because of their location with respect to the selected memory cell, are more vulnerable to such disturbance than other memory cells.

Figure 7:
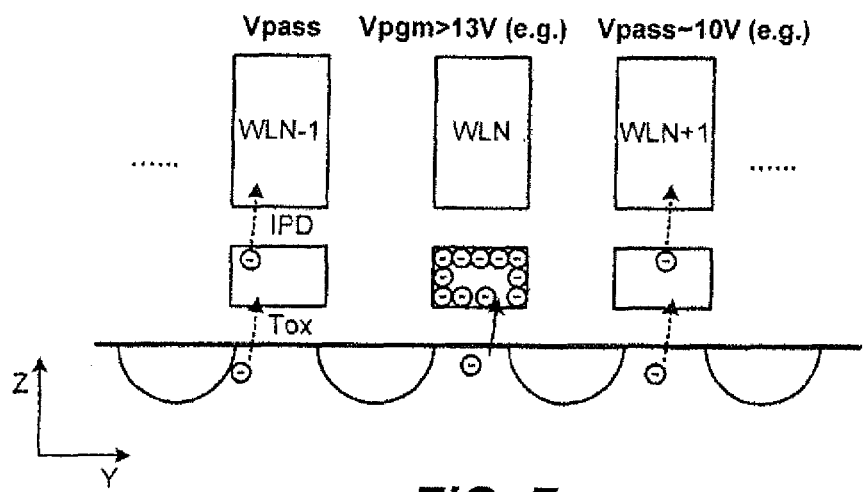
FIG. 7 shows an example of disturbance during programming.

FIG. 7 shows a cross section of a portion of a NAND string during programming of a memory cell. A programming voltage Vpgm is applied to the selected word line WLn (this may be applied as a series of pulses over some period of time). This is a relatively high voltage (>13V in this example) that generates an electric field capable of causing electrons to tunnel from the channel region, through the gate dielectric, into the charge storage element. While programming is performed along word line WLn, other word lines on either side of WLn receive a pass voltage, Vpass, which is sufficient to turn on other memory cells along the NAND strings containing the selected memory cells. Vpass is less than Vpgm (approximately 10 volts in this example). However, Vpass may be sufficient to cause at least some electrons to enter memory charge storage elements through the gate dielectric (e.g., having thickness $T_{OX}$) of unselected cells, and even through the inter-polysilicon dielectric (IPD), as shown. In particular, charge storage elements of memory cells on either side of the selected memory cell may experience not only the electric field produced by Vpass on their respective word lines WLn−1, WLn+1, but also some effect from the higher voltage Vpgm on WLn. This makes disturbance more likely along WLn−1 and WLn+1 than along other word lines when programming cells of WLn.

Figure 8:
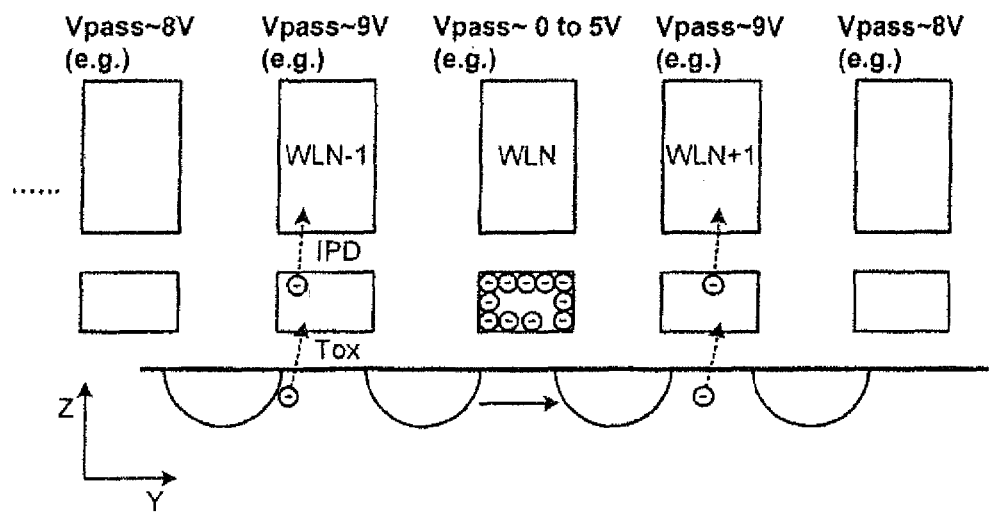
FIG. 8 shows an example of disturbance during reading.

FIG. 8 shows a cross section of a portion of a NAND string during reading of a memory cell. A read voltage, or a series of read voltages, is/are applied to a selected word line WLn. In this example, read voltages range from zero to five volts (0-5V). Unselected word lines receive a pass voltage, Vpass, in order to turn on other memory cells in series with the selected memory cells along NAND strings. Vpass may be in the range of eight to nine volts (8-9V) with higher voltage (9V) applied to word lines immediately adjacent to the selected word line. As a result of applying relatively high voltages to unselected word lines, some electrons may pass through the gate dielectric (e.g., having thickness $T_{OX}$) and into charge storage elements, and even through the inter-polysilicon dielectric (IPD), as shown. This changes the amount of charge stored and thus changes the memory cell threshold voltage. This effect may be more pronounced along word lines immediately adjacent to the selected word line because of the higher Vpass applied to these word lines. Thus, cells along WLn−1 and WLn+1 may be more affected than cells along other word lines when reading WLn.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending up from the wafer surface. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088.

Figure 9:
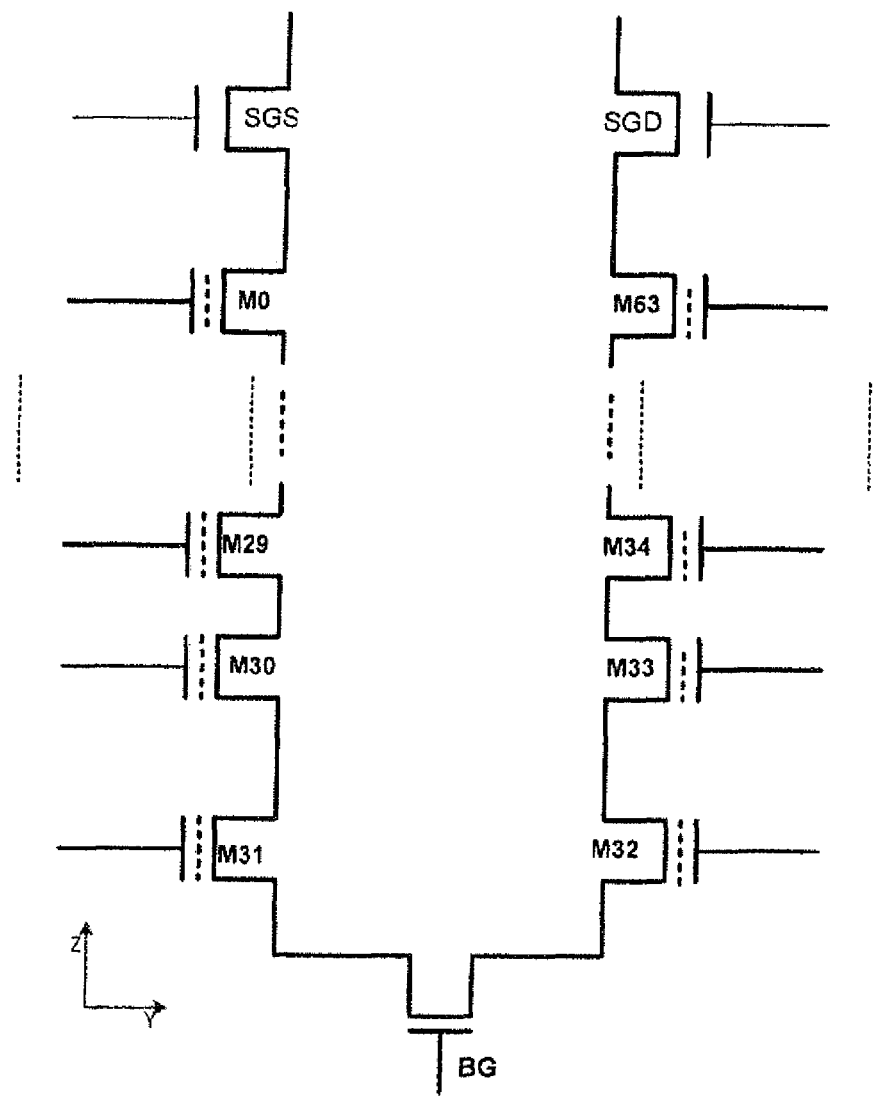
FIG. 9 is a schematic of a 3-D NAND string.

FIG. 9 is a schematic showing an example of one such arrangement in which memory cells M0-M63 are formed along two sides of a U-shaped NAND string. (Not all 64 memory cells are shown for clarity of illustration, dashed lines indicate omitted memory cells.) Memory cells M0-M31 are formed on one side (left side of FIG. 9) with memory cells M32-M63 formed on the other side (right side of FIG. 9). Separate control gates are formed in each memory cell in a string where a word line couples to the cell's channel. Word lines extend horizontally to connect control gates of memory cells of other strings in the same row. Source and drain select transistors are provided at either end of the string to allow the string to be selectively connected to external connections for reading, writing, and erasing. At the bottom of the U-shaped string the two sides are connected. This connection may be formed by a controllable transistor, or gate (back gate, "BG"), as shown in FIG. 9 so that one side of the string can be isolated from the other. In some cases, one or more memory cells may be considered as dummy cells that do not store data because they are unreliable. For example, memory cells immediately adjacent to select transistors may be unreliable because of their location and may be dummy cells. Thus, rows of dummy cells may be formed, connected by dummy word lines.

Figure 10:
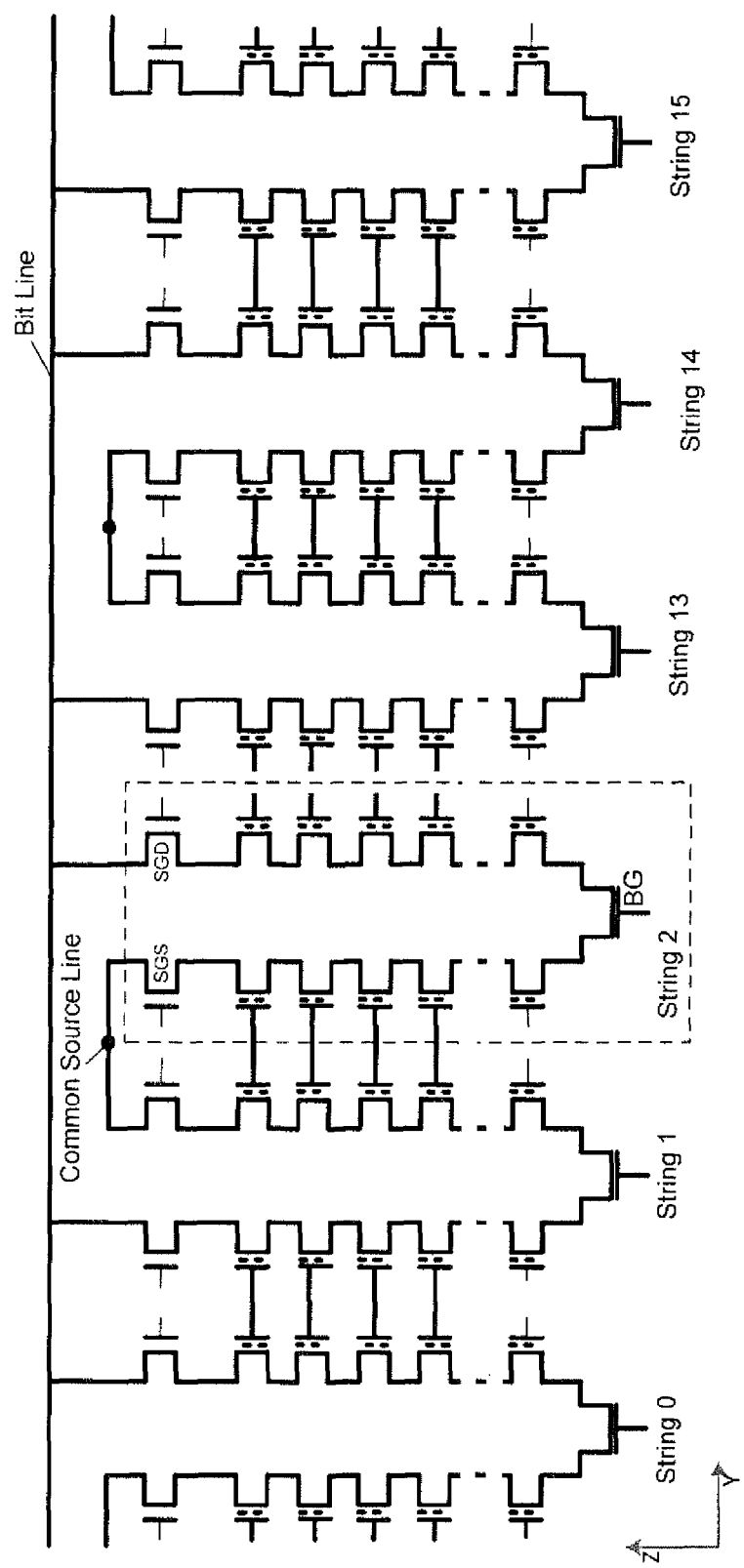
FIG. 10 is a schematic of 3-D NAND strings in an array.

FIG. 10 is a schematic that shows the string of FIG. 9 (outlined by dashed lines) connected as string 2 of 16 strings that are connected to a common bit line in a block of a 3-D memory array (strings 3-12 are omitted from FIG. 10). One end of the string (the right end in FIG. 10) is connected to the bit line, while the other end of the string (the left end in FIG. 10) is connected to a common source line. The bit line extends in the y-direction as shown in FIG. 10 and connects the drains of strings 0-15 along the y-direction. (The x, y, and z axes follow the conventional scheme where the z axis is perpendicular to the surface of the substrate). The common source line extends in the direction perpendicular to the plane of FIG. 10 (i.e. it extends in the x-direction) and connects to other similar strings that are connected to other bit lines. Strings are arranged in an alternating pattern with source sides of neighboring strings adjacent each other and drain sides of neighboring strings adjacent to each other in the y-direction (i.e. drain to the left in string 1, then drain to the right in string 2, then drain to the left in string 3, etc.). This allows adjacent strings to share common source lines and share word lines.

Word lines extend in the x-direction. Word lines are shared between adjacent strings as shown, and may be connected so that word lines of different strings within a block are connected together (further described below). Select lines also extend in the x-direction but are not shared. They are separate so that they can be separately biased to individually select rows of strings. It will be understood that the strings 0-16 represented in FIG. 10 form just a small portion of the overall memory array, with many more such strings along the bit line (i.e. on either side of the portion shown), and with many more bit lines.

Figure 11A:
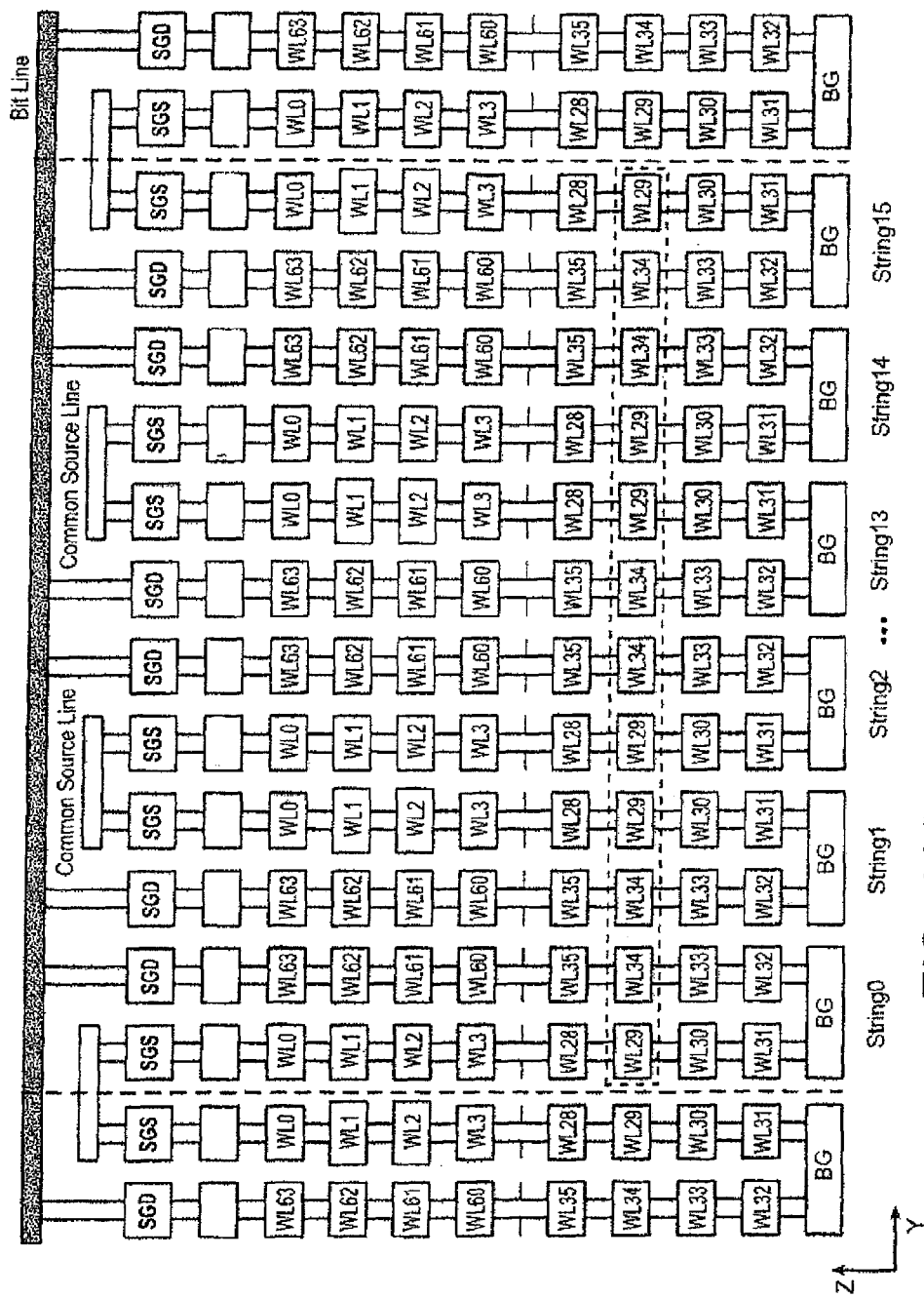
FIG. 11A shows a cross section of an example of a 3-D NAND array.

FIG. 11A shows a physical implementation of the circuit illustrated in FIG. 10. The bit line extends as a continuous conductor (e.g. metal line) in the y-direction with vertical connections formed between the bit line and drains of strings. Below the bit line, common source lines extend perpendicular to the cross section shown (i.e. extend in the x-direction) and connect sources of neighboring strings. Source select lines extend in the x-direction and form source select gates (SGS) where they intersect vertical columns. Drain select lines extend in the x-direction and form drain select gates (SOD) where they intersect vertical columns. Word lines WL0-WL63 extend in the x-direction and form control gates of memory cells where they intersect vertical columns. In one example, word lines are formed from conductive layers separated by dielectric layers, with channels of memory cells being formed in vertical holes ("memory holes") that extend through the conductive layers and dielectric layers.

The structure of the 3-D memory array of FIG. 11A is comprised of multiple layers, with each layer having the same replicated pattern (e.g. layer in dashed lines containing WL34 and WL29 is replicated at each level). Taking word line 34 as a typical word line, it can be seen that word line 34 alternates with word line 29 along the y-direction. While word lines of each string may be separately controlled in some memory systems, combining word lines saves space for driver circuits. In the present example, all word lines of the same number within a block are formed from a single portion of conductive material and together form an electrically continuous unit. For example, all word lines marked WL34 are formed of a single electrically-conductive portion of material, and all word lines marked WL29 are formed of another electrically-conductive portion of material (which may initially be formed from the same layer).

Figure 11B:
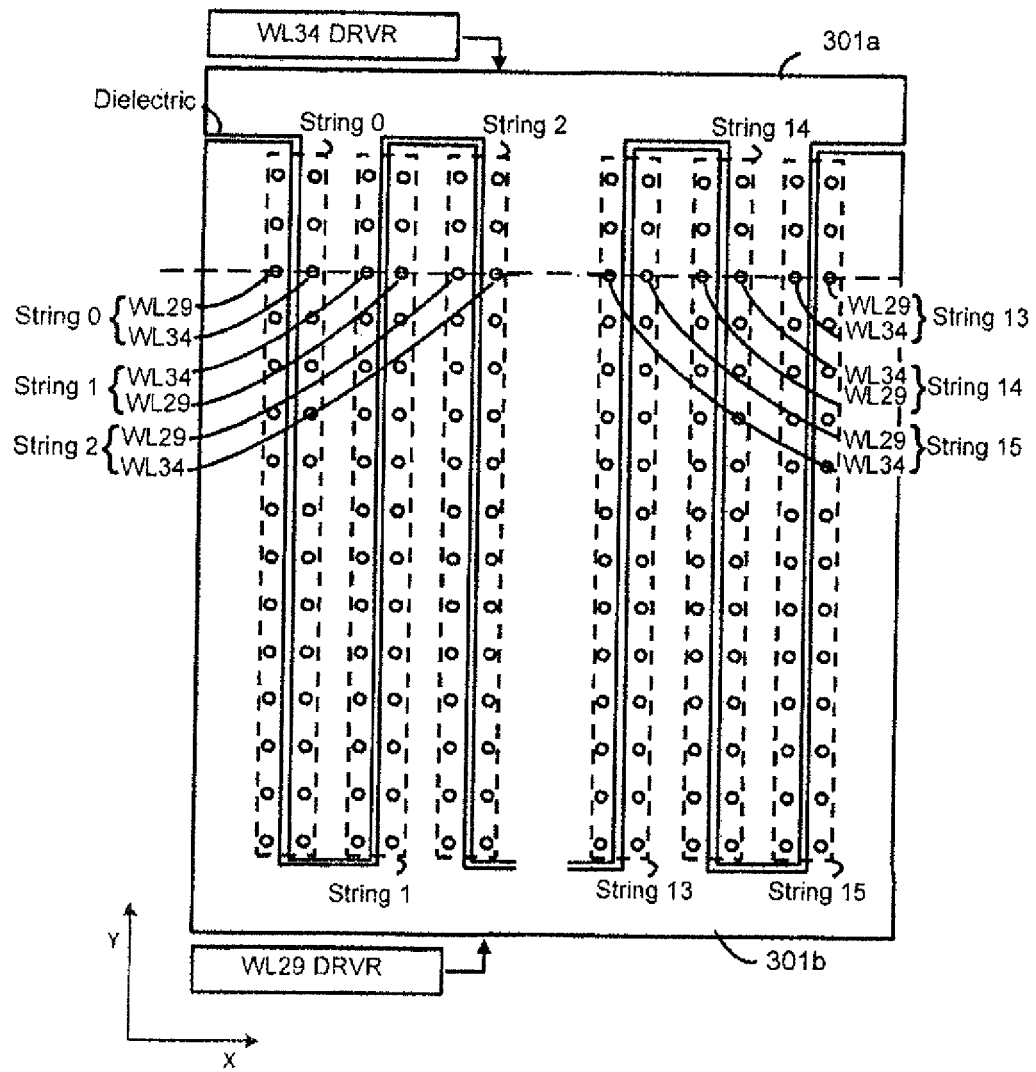
FIG. 11B shows another cross section of the 3-D NAND array of FIG. 11A.

FIG. 11B shows a top-down view of the structure of word lines 34 and 29 with the horizontal dashed line showing the location of the cross section of FIG. 11A. It can be seen that a portion of conductive material 301a extends along the top in this view with extensions extending down (negative y-direction). These extensions form pairs of word lines shown in FIG. 11A (WL34) with memory cells formed where memory holes containing channels pass through the word lines. A driver circuit "WL34 DRVR" is connected to this portion of conductive material so that a controllable voltage can be applied to it and thus to control gates of all memory cells connected to any WL34 in this block. A similar portion of conductive material 301b extends along the bottom in this view with extensions extending up (positive y-direction). These extensions form pairs of word lines shown in FIG. 11A (WL29) with memory cells formed where memory holes pass through the word lines. A driver circuit "WL29 DRVR" is connected to this portion of material so that a controllable voltage can be applied to it and thus to control gates of all memory cells connected to any word line 29 in this block. The two portions of material 301a, 301b may be formed by depositing a single layer of conductive material and patterning it into the portions shown (and similar portions for other blocks). A dielectric material may be used to fill the gap between portions. For example, a Shallow Trench Isolation (STI) process may be used to physically separate, and electrically isolate, the two portions. Dielectric layers above and below these portions (in the z-direction) insulate these portions from other similar layers. This pattern may be replicated for each pair of word lines in the block so that for 64 word lines, there are 32 layers similar to that shown in FIG. 11B, with dielectric layers in between.

3-D NAND Data Disturbance

Accessing a 3-D memory array like that described above is different to accessing a 2-D array because in any given block there are multiple strings connected to the same bit line. Thus, to access particular data, it is necessary to select not only the word line and bit line(s), but also to select a string. One consequence of such connected bit lines is that certain 3-D memory cell disturbance scenarios may occur in addition to the disturbance scenarios described with respect to planar NAND.

For example, to program data along WL34, WL34 DRVR applies a program voltage, Vpgm, to WL34 (e.g. as a series of pulses) and a pass voltage is applied to all other word lines (WL0-WL33, and WL35-WL63) in all strings of the block. Individual bit line voltage may be low to create a sufficient electric field for programming a memory cell, or may be high to inhibit further programming depending on the data being programmed. In another example, to read data along WL34, a read voltage is applied to WL34 and a pass voltage is applied to all other word lines (WL0-WL33, and WL35-WL63). These voltages are applied to all word lines in all strings of the block.

Erasing may be performed on an entire block or on a sub-block extending along one or more word lines within the block (e.g. along WL34 alone, WL34 plus some other word line(s)) and may include applying a relatively high voltage to bit lines and of the block along with applying a low (e.g. 0V) voltage along selected word line(s). These voltages have effects beyond the memory cells that are selected (e.g. beyond WL34). In particular, these voltages may cause some disturbance of programmed memory states of cells that are not selected or erase.

While some of the disturbance scenarios are similar to disturbance scenarios of planar NAND, there are additional disturbance scenarios that are specific to 3-D. For example, the connected word lines in a block described above may provide additional scenarios that can disturb data. While aspects of the present invention are directed to planar NAND, or to both planar NAND and 3-D memory arrays, certain aspects are directed specifically to 3-D memory arrays and to solving problems relating to data disturbance in such 3-D memory arrays.

Figure 12A:
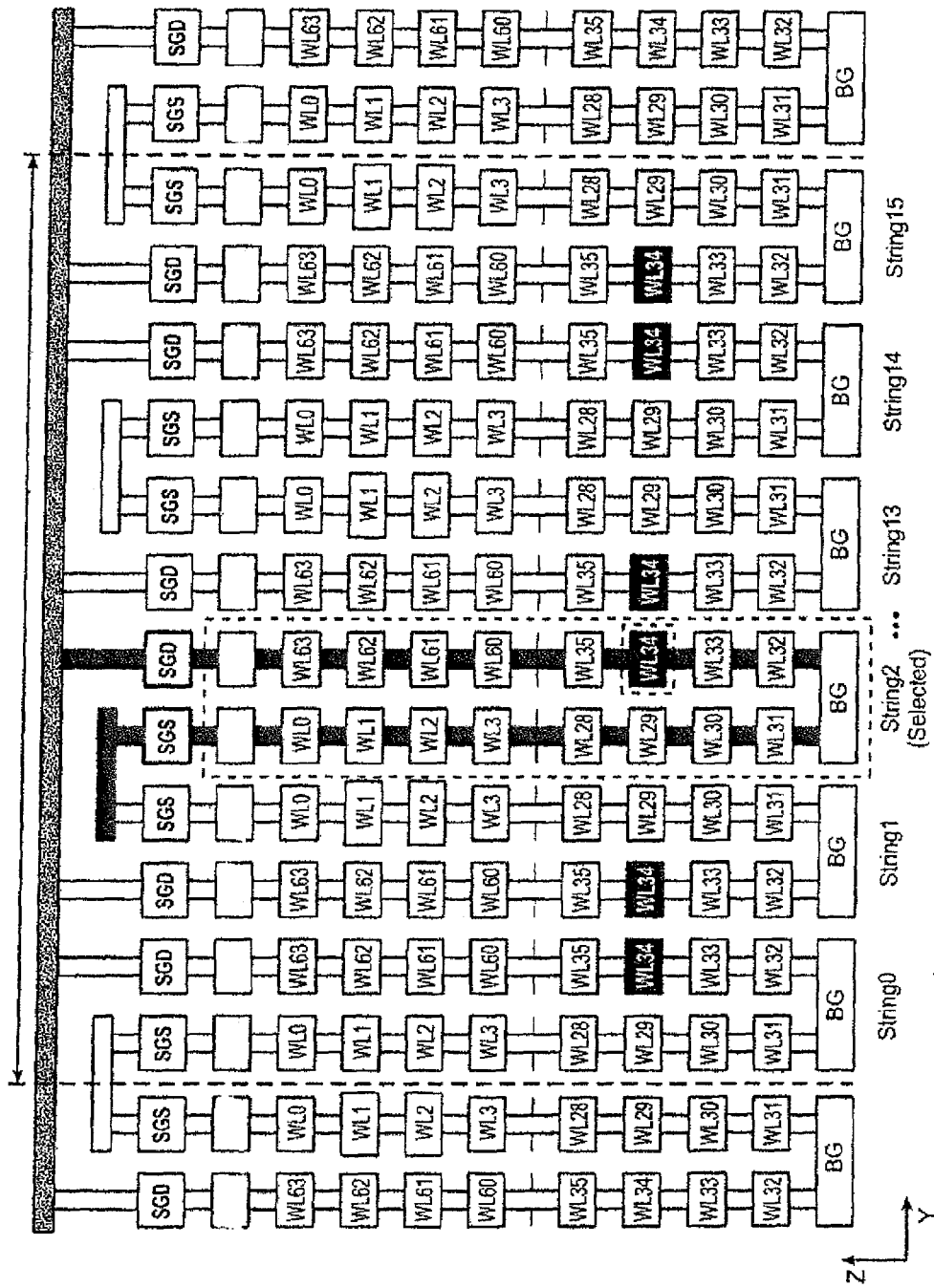
FIG. 12A shows how word lines in different strings may be coupled.

FIG. 12A shows the case where WL34 of string 2 is selected for an access operation. Where the operation is a programming operation, a program voltage is applied to WL34 and a pass voltage is applied to all other word lines. This pass voltage may cause disturbance in memory cells of unselected word lines in selected strings (i.e. in string 2 shown, and string 2 of other bit lines). Where the operation is a read operation, a read voltage is applied to WL34 and a pass voltage is applied to all other word lines. This pass voltage may cause disturbance in memory cells of unselected word lines in a selected string (it may cause charge to enter charge storage elements thus changing threshold voltage and changing memory state, for example from erased to programmed 1 to 0, or 11 to 01). Erasing a sub-block such as WL34 includes applying a high voltage to the channel and applying a low voltage to WL34. Other word lines may receive a relatively high voltage to prevent erase. However, some disturbance may occur along unselected word lines.

In addition to disturbance in a selected string, disturbance may occur in unselected strings. In the 3-D design described above, word line voltage is applied to all similar word lines throughout a block. While only a single string may be selected, the word line voltage may affect cells in unselected strings.

Figure 12B:
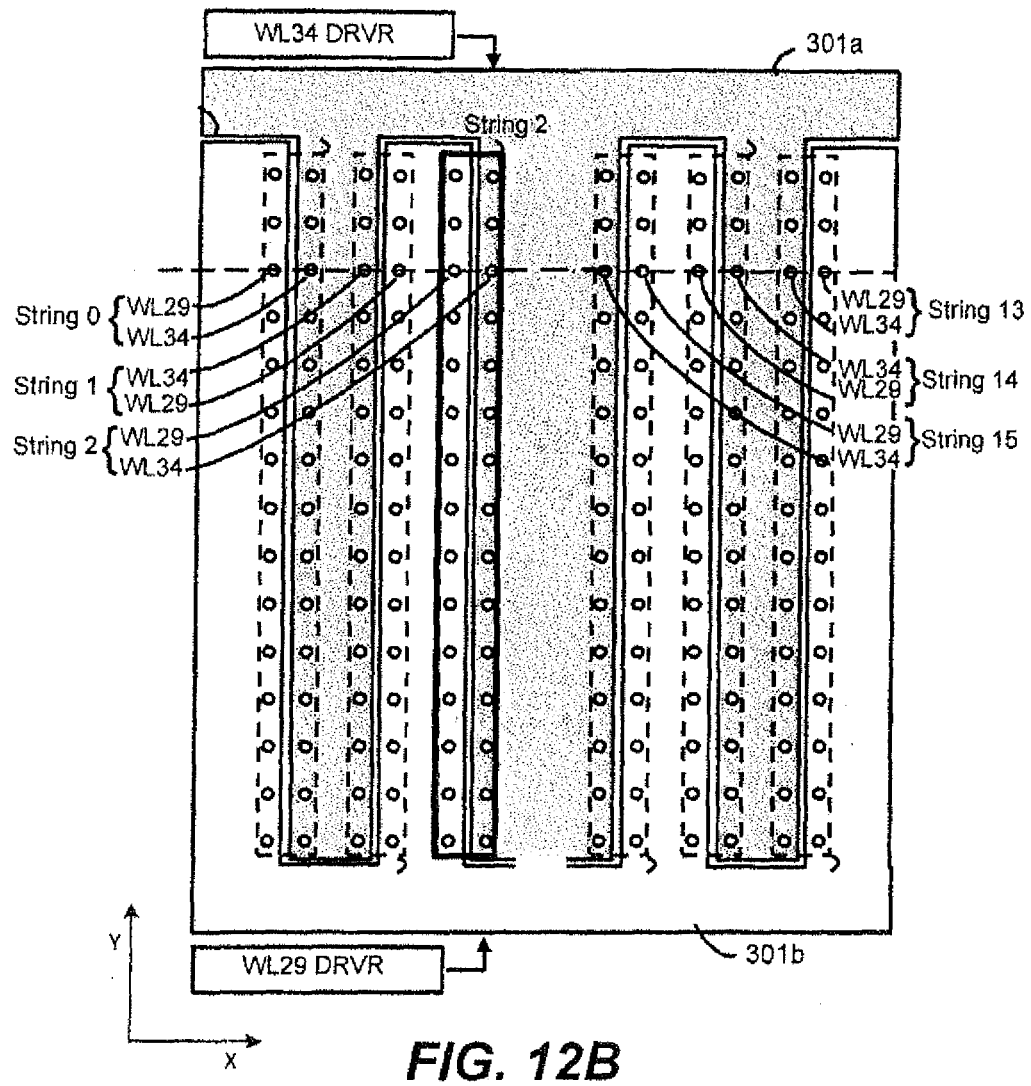
FIG. 12B shows another view of how word lines in different strings may be coupled.

FIG. 12B shows a bias applied to word line 34 of the block by WL34 DRVR (shaded portion indicates portion of material 301*a* that is biased by WL34 DRVR) when accessing WL34 in string 2. Because this bias is applied to WL34 in every string in the block, there is potential for disturbance in every unselected string. For example, while reading WL34 in string 2, other strings are isolated by select gates (which are turned off). This allows Vpass applied to unselected word lines to couple to the channels of these strings and raise the channel voltage. With WL34 at low voltage (0-5V) and the channel at some voltage between zero and Vpass (e.g. 0-8V) an electric field may be generated that causes some electrons to tunnel from the charge storage element, through the tunnel dielectric, into the channel. This can cause the threshold voltage of the cell to drop so that it is later read as being in a different state to its programmed state. Such a "soft erase" or "Vt downshift" disturbance is a predictable result of reading a particular location.

While a single read operation may not cause significant disturbance along either unselected word lines of the same string, or along the selected word line of unselected strings, repeated read operations may produce significant disturbance. The exact number of operations that result in significant disturbance (e.g. sufficient to change memory state of at least one cell) may depend on the physical memory design, amount of wear in a particular location, voltages used etc. In general, it is desirable to take action to protect data before the disturbance is sufficient to make data uncorrectable by Error Correction Code (ECC). While a small number of errors may be correctable by ECC, once the number of errors exceeds the capacity of the ECC system, the data may be uncorrectable and may permanently lost.

Data Scrub

One way to protect data is to scrub the data. Scrubbing generally involves reading the data from the memory array, identifying disturbed data, and fixing the disturbed data. Examples of scrubbing are described in U.S. Pat. Nos. 7,839,685 and 7,518,919. In one example, data is read out from the memory array, corrected using ECC if necessary, then written back to the memory array (e.g. in a different location). By rewriting the data in this manner, data stored in cells that may have suffered some disturbance is rewritten in cells without such disturbance (e.g. where cells have drifted away from their newly programmed distributions the newly written cells will have newly programmed distributions). In some cases, some scrubbing may be performed without rewriting the data to a new location. For example, where threshold voltages of particular memory cells have drifted down (charge has leaked) they may undergo a limited programming to restore their threshold voltages. In general, data deteriorates over time and as a result of result of disturbance caused by accessing neighboring data so that refreshing the data may be desirable or even necessary.

According to an embodiment of the present invention, scrubbing operations are prioritized so that data that is in danger because of its location receives priority. For example, data of the same string, but a different word line, as some frequently read data may be prioritized. For example, if WL34 of string 2 above contains frequently read data, then string 2: WL0-33 and WL35-63 may also be prioritized for scrub. Data along the same word line, but a different string, as some frequently read data may be prioritized. For example, if WL34 of string 2 contains frequently read data, then data of WL34 in strings 0-1 and 3-15 in the same block may be prioritized. Prioritization may be achieved by maintaining a points system in which a number of points is associated with a portion of data (e.g. with a page that extends along a portion of a word line). The number of points may indicate the priority for scrubbing the portion of data and may be referred to as "scrub points."

Figure 13:
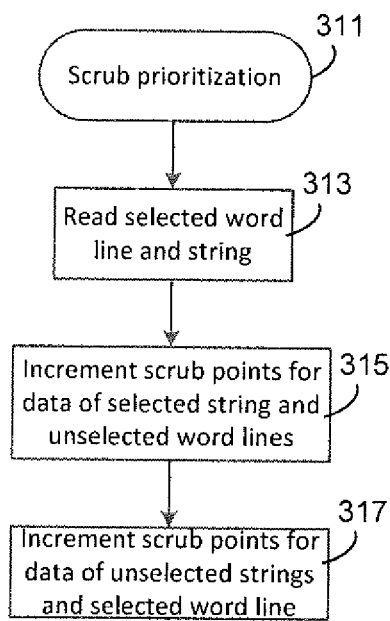
FIG. 13 shows a scheme for assigning scrub prioritization points.

FIG. 13 illustrates an example of a scrub prioritization scheme 311. Data is read from a selected word line and string for some group of bit lines (a page) 313. Scrub points for data of the selected string and unselected word lines are incremented 315. Scrub points may be incremented uniformly for all such word lines, or may be incremented according to a scheme which weights certain word lines (e.g. closer to the word line that is read). Scrub points are also incremented for data of unselected strings and selected word lines 317. Scrub points may be incremented uniformly for all such word lines, or according to a weighted scheme. These two incrementing steps may use similar or dissimilar increments depending on the expected degree of disturbance for each location. In some memory arrays only one of these incrementing steps may be necessary (if read disturbance of only one type is significant).

Figure 14:
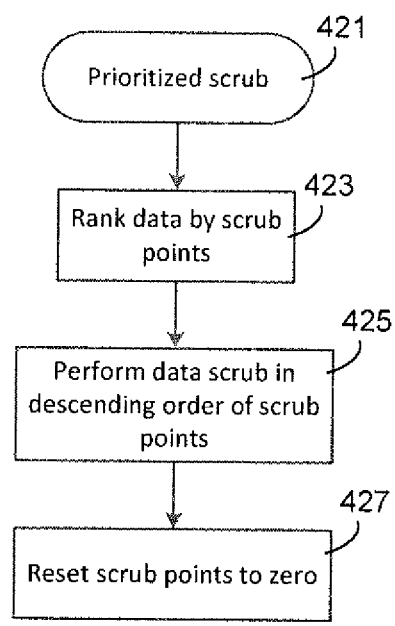
FIG. 14 shows a scheme for prioritizing scrub according to points.

FIG. 14 illustrates a prioritized scrub scheme 421. Data that is assigned a number of scrub points is ranked according to the number of points 423. The data with the largest number of scrub points is most likely to be damaged.

Therefore, data scrub is performed in descending order of scrub points, starting with data that has the highest number of points (exposed to the most potentially damaging voltages) 425. When data is scrubbed, the scrub points number for that data is reset to zero 427. Thus, newly scrubbed data has the lowest ranking for a subsequent scrub and starts to move up the ranking by accumulating points as it is exposed to potentially damaging voltages.

Disturbance and Physical Device Characteristics

In addition, or as an alternative to prioritizing scrubbing of particular data based on exposure to potentially damaging voltages applied when accessing other data, data may be scrubbed based on physical characteristics of the memory cells in which the data is stored. In particular, where a memory array has a reasonably predictable pattern of memory cell characteristics, such a pattern may be used to predict which memory cells are most likely to be disturbed. Such a technique is particularly suitable for certain types of 3-D memory.

Figure 15:
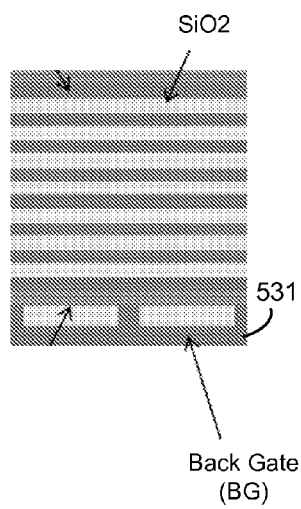
FIG. 15 shows a 3-D NAND memory array at an intermediate stage of fabrication.

FIGS. 15-18 show formation of a 3-D memory array of the type previously shown. FIG. 15 shows a substrate 531 with a stack of layers on an upper surface. The substrate contains back gate structures which are later removed when forming the back gate. The stack of layers consists of alternating layers of Boron-doped (electrically conductive) polysilicon ("poly") and insulating dielectric (e.g. SiO2).

Figure 16:
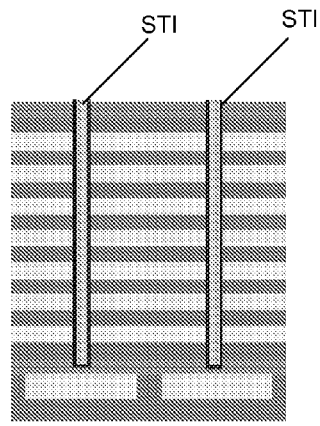
FIG. 16 shows the 3-D NAND memory array of FIG. 15 at a later stage of fabrication.

FIG. 16 shows formation of Shallow Trench Isolation (STI) trenches with dielectric filling to provide isolation between the two sides of a string. This dielectric separates the portions of conductive material that make up the word lines of a given layer (e.g. separating WL34 and WL29 above).

Figure 17:
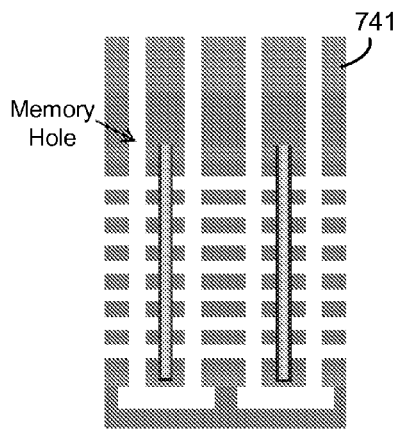
FIG. 17 shows the 3-D NAND memory array after formation of memory holes.

FIG. 17 shows additional layers including an etch mask layer 741 with openings that are used to etch cylindrical memory holes as shown. In addition to etching the memory holes, a selective etch is used to remove insulating dielectric while leaving doped polysilicon throughout the stack. Back gate structures are also removed by selective etching. The remaining doped polysilicon portions become word lines.

Figure 18:
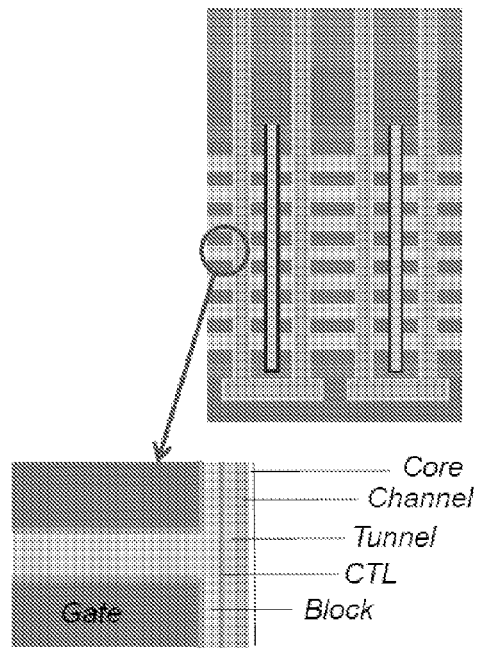
FIG. 18 shows detail of a structure formed in the memory holes of FIG. 17.

FIG. 18 shows the structure of FIG. 17 after deposition of a stack of layers in the memory holes to form memory cells. It can be seen that a blocking dielectric "Block" is deposited on the doped polysilicon to provide electrical isolation. A Charge Trapping Layer (CTL) is deposited on the blocking dielectric. The CTL forms charge storage elements where the CTL is in close proximity to polysilicon word line. A tunnel dielectric is deposited to provide electrical isolation and to allow charge to tunnel into the CTL under certain conditions. A channel material is deposited to form the channel of the memory cells along the string. A core material is deposited that forms the core of the column that is located in the memory hole.

While FIGS. 17-18 show an idealized profile for memory hole formation and subsequent formation of memory cells, real profiles may deviate from this profile, and memory holes may not have perfect cylindrical shapes. A memory hole may have a larger diameter at some locations than others leading to memory cells with different device characteristics. Such differences may be predictable to some extent so that memory operation can compensate accordingly.

Figure 19:
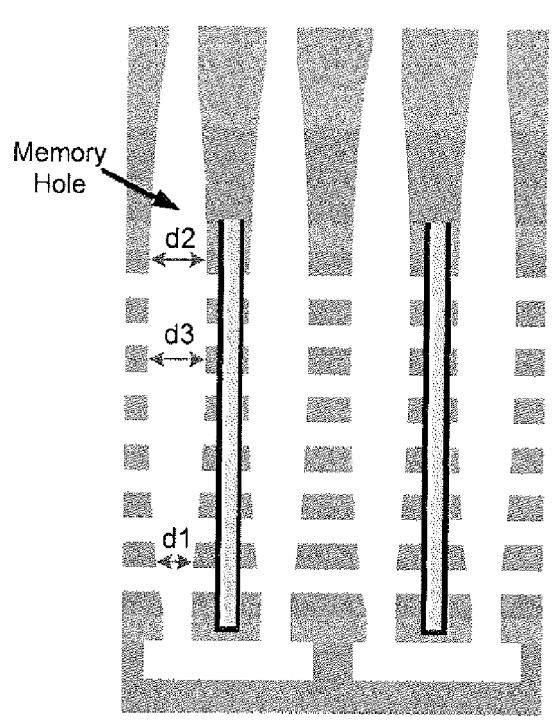
FIG. 19 shows variation in memory hole diameter.

FIG. 19 shows a cross section of memory holes formed by an etch process that provides a narrower memory hole at the bottom (diameter=d1) than at the top (diameter=d2), with the widest memory hole close to the middle of the stack (diameter=d3). In general, such a profile is a characteristic of the process used (i.e. materials being etched, etch chemistry, temperature, pressure, time, etc.). Thus, the profile of a memory hole is generally non-uniform in a predictable way (though not necessarily in the particular way shown in FIG. 19).

In a cylindrical memory cell such as described here, the smaller the cylinder of the memory hole at a particular location, the greater the coupling between the control gate (word line) and the channel. As the diameter of the memory hole gets smaller, the electric field strength between the control gate and channel gets larger for a given voltage difference, so that a given control gate voltage has more effect, thus reducing program and erase times. This means that disturbance is more likely in memory cells with small memory holes than in memory cells with large memory holes.

According to an aspect of the present invention, data that is stored in memory cells that have (or likely to have) smaller memory holes are prioritized for scrubbing. Memory hole size is predictable as a function of location within a stack of layers. For example, the lowest memory cells in the stack, nearest to the back gate, have the smallest memory holes in the above example and are most susceptible to disturbance. Memory cells at the top or at some mid-point may be least susceptible to disturbance. Thus, the susceptibility of memory cells to disturbance may be predicted based on location, by word line, and appropriate action can be taken by prioritizing scrubbing of the data in the most susceptible cells.

Figure 20:
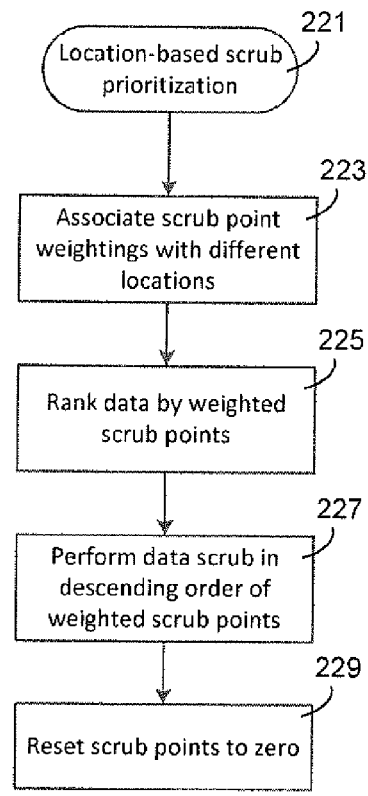
FIG. 20 illustrates a scheme for location based scrub prioritization.

FIG. 20 is a flow chart showing a scheme for location-based scrub prioritization 221 that uses a scrub point system that is weighted according to the location of the data to be scrubbed. Thus, for example, weighted scrub points are accumulated differently for different word lines that are exposed to the same voltages, with the most susceptible word lines (e.g. WL31, WL32 in previous examples) accumulating a higher ranking even under the same conditions as other word lines. Weighting may be provided as an offset to the scrub points for particular word lines (e.g. add X scrub points for particular word lines) or may be provided as a coefficient (e.g. multiply accumulated scrub points by Y for particular word lines).

Initially scrub point weightings are associated with different locations 223. This can be on a word line by word line basis, or by some grouping of word lines (e.g. zones that contain two or more word lines). As points are accumulated, the weighted scrub points (not raw scrub points) are used to rank the data for scrub 225. Scrubbing is then performed in the order of the weighted scrub points 227, with scrub points reset to zero after scrubbing 229.

Aggressor Containment

In addition to using location as an indicator of how to prioritize scrub, certain locations may be identified as low-risk locations where reading these locations provides a relatively low-risk to other data. For example, word lines that have relatively large memory holes may be considered to provide low-risk locations because reading such a word line in a particular string has a relatively small influence on data of the selected word line in other strings. In contrast, word lines at the bottom of the stack may provide relatively high-risk locations because reading a selected word line in a particular string has a relatively large influence on data of the selected word line in other strings. Identification of locations as high-risk or low-risk may use scrub point weightings as described above, or some other measure of potential for disturbance. Thus a range of risk ratings may be applied to word lines.

Certain data may be assigned to be stored in a particular physical location based on the nature of the data. For example, aggressor data that has a tendency to cause disturbance of other data (e.g. because it is frequently read) may be stored in a low risk location thus reducing its tendency to disturb other data. Aggressor data may be identified from experience (i.e. data is observed to be frequently read over some period) or may be identified because of its use (e.g. certain logical addresses may be used by a memory controller to store data that the controller reads frequently) or may be identified in some other manner.

Figure 21:
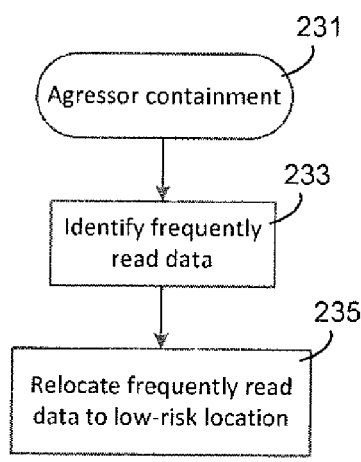
FIG. 21 illustrates a scheme for aggressor containment.

FIG. 21 shows a scheme for containing aggressor data 231 by assigning it to a particular physical location. Frequently read data is identified (e.g. by keeping track of read commands) 233. Then, the frequently read data is relocated to a low-risk location 235, such as a word line in the middle or top of the stack in the example above. Relocation may be performed immediately, or during the next scrub operation, or the next erase operation, or at any suitable time. Different data may be identified as frequently read at different times and so the data stored in low-risk locations may change over time.

Figure 22:
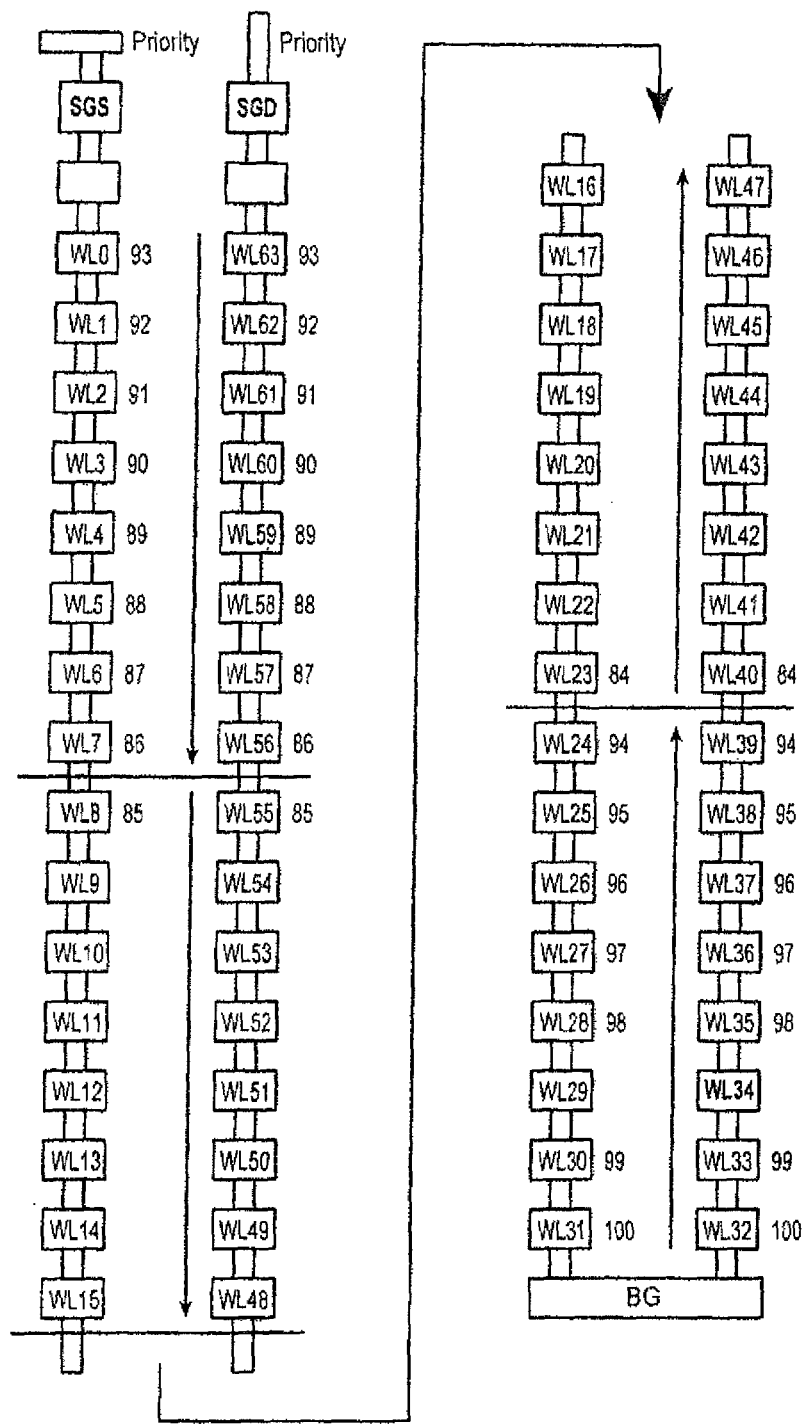
FIG. 22 shows an example of a prioritization scheme.

FIG. 22 shows an example of weighted points associated with different word lines in a string when WL34 is read. In this example, the highest weighting is given to word lines at the bottom (WL31, WL32, which receive weighting 100) with the weighting decreasing with distance from the bottom. Word lines in the middle have substantially uniform weighting (e.g. WL8-WL15 and WL48-WL55 all have weighting 85) because the memory holes have reasonably uniform. Weighting increases towards the top of the stack (up to 93 for WL0). These weightings may also be used as indicators of high-risk and low-risk (e.g. WL8-WL23 and WL40-WL55 are low risk suitable for aggressor containment). It will be understood that FIG. 22 is simply an example based on a particular design and fabrication process. Different designs and different processes will result in different geometries that may be best addressed with different weighting schemes.

While the above description refers to a scrub points scheme with weighting, this is simply an example and any suitable scheme for prioritization may be used. Either location or history may be used alone, or in combination, and may be used in combination with other factors to affect a scrub prioritization scheme. In addition to read operations, nearby programing and sub-block erase operations may be taken into account when prioritizing scrubbing. Data that is found to be damaged (e.g. by ECC) may be prioritized for scrub, and any other appropriate factors may also be considered in a scrub prioritization scheme.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. An apparatus, comprising:
an array of non-volatile memory cells;
a first plurality of nonvolatile memory cells at a first location in the array of non-volatile memory cells, the first plurality of nonvolatile memory cells assigned to store portions of data that are not frequently read, the first plurality of nonvolatile memory cells having first diameters of memory holes; and
a second plurality of nonvolatile memory cells at a second location in the array of nonvolatile memory cells, the second plurality of nonvolatile memory cells assigned to store portions of data that are frequently read, the second plurality of nonvolatile memory cells having second diameters of memory holes, the first diameters being smaller than the second diameters.

2. The apparatus of claim 1, wherein the array of non-volatile memory cells is formed as a stack of layers and at least a portion of the first plurality of nonvolatile memory cells is located near a bottom of the stack.

3. The apparatus of claim 1, wherein the first plurality of nonvolatile memory cells are located along a first word line located a first height above a substrate and the second plurality of nonvolatile memory cells are located along a second word line located a second height above the substrate, the second height being greater than the first height.

4. The apparatus of claim 3, wherein the first word line has a first weighting and the second word line has a second weighting for prioritization of data maintenance operations.

5. The apparatus of claim 4, wherein the first weighting is associated with a first plurality of word lines of a first zone and the second weighting is associated with a second plurality of word lines of a second zone.

6. The apparatus of claim 5, wherein the array of non-volatile memory cells is formed as a stack of layers and the second plurality of word lines are located in middle layers of the stack.

7. The apparatus of claim 5, wherein the first plurality of word lines are located below the second plurality of word lines in the stack of layers.

8. An apparatus, comprising:
a three-dimensional array of non-volatile memory cells formed in a plurality of layers of memory cells disposed above a substrate;
a plurality of driver circuits configured to provide voltages to portions of the three-dimensional array of non-volatile memory cells;
a first word line in the three-dimensional array of non-volatile memory cells, the first word line assigned to store data identified as likely to be infrequently read, the first word line located a first height above the substrate;
a second word line in the three-dimensional array of non-volatile memory cells, the second word line assigned to store data identified as likely to be frequently read, the second word line located a second height above the substrate; and
a plurality of memory holes extending through the plurality of layers of memory cells, the plurality of memory holes having a first diameter at the first height above the substrate and having a second diameter at the second height above the substrate, the second diameter being larger than the first diameter.

9. The apparatus of claim 8, wherein the first word line is formed in a first layer, the second word line is formed in a second layer, and the first layer is below the second layer.

10. The apparatus of claim 8, wherein the first word line has a first weighting and the second word line has a second weighting for prioritization of data maintenance operations.

11. The apparatus of claim 10, wherein the first weighting is associated with a first plurality of word lines of a first zone and the second weighting is associated with a second plurality of word lines of a second zone.

12. The apparatus of claim 11, wherein the array of nonvolatile memory cells is formed as a stack of layers and the second plurality of word lines are located in middle layers of the stack.

13. The apparatus of claim 12, wherein the first plurality of word lines are located below the second plurality of word lines in the stack of layers.

14. The apparatus of claim 8, further comprising a plurality of NAND strings, each NAND string extending vertically along a memory hole.

15. A system, comprising:
a memory array that includes memory cells formed in a plurality of physical layers of memory cells disposed above a substrate;
a controller connected to the memory array, the controller including interface circuits;
a block in the memory array, the block including a first word line in a first physical layer, the first word line assigned to store data that is infrequently read, and a second word line located in a second physical layer, the second word line assigned to store data that is frequently read, the first physical layer located below the second physical layer; and
a memory hole extending through the first physical layer and through the second physical layer, the memory hole having a first diameter through the first physical layer and a second diameter through the second physical layer, the first diameter being smaller than the second diameter.

16. The system of claim 15, wherein the first word line has a first weighting and the second word line has a second weighting for prioritization of maintenance operations.

17. The system of claim 16, wherein the first weighting is associated with a first plurality of word lines of a first zone and the second weighting is associated with a second plurality of word lines of a second zone.

18. The system of claim 17, wherein the second plurality of word lines are located in middle layers of the plurality of physical layers.

19. The system of claim 18, wherein the first plurality of word lines are located below the second plurality of word lines in the plurality of physical layers.

20. The system of claim 15, further comprising a NAND string extending vertically along the memory hole.

* * * * *